(12) United States Patent
Wang et al.

(10) Patent No.: US 11,641,762 B2
(45) Date of Patent: May 2, 2023

(54) DISPLAY PANEL AND MANUFACTURING METHOD THEREOF, AND DISPLAY APPARATUS

(71) Applicant: BOE TECHNOLOGY GROUP CO., LTD., Beijing (CN)

(72) Inventors: Hejin Wang, Beijing (CN); Zewen Bo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 9 days.

(21) Appl. No.: 17/352,517

(22) Filed: Jun. 21, 2021

(65) Prior Publication Data
US 2022/0029138 A1 Jan. 27, 2022

(30) Foreign Application Priority Data
Jul. 21, 2020 (CN) .......................... 202010704341.2

(51) Int. Cl.
| | | |
|---|---|---|
| H01L 51/52 | (2006.01) | |
| G06F 3/041 | (2006.01) | |
| G06F 3/044 | (2006.01) | |
| H01L 27/32 | (2006.01) | |
| H01L 51/56 | (2006.01) | |

(52) U.S. Cl.
CPC ........ *H01L 51/5284* (2013.01); *G06F 3/0412* (2013.01); *G06F 3/0443* (2019.05); *G06F 3/0446* (2019.05); *H01L 27/323* (2013.01); *H01L 51/56* (2013.01); *G06F 2203/04103* (2013.01); *G06F 2203/04111* (2013.01); *H01L 27/3211* (2013.01); *H01L 2251/5338* (2013.01)

(58) Field of Classification Search
CPC .... G06F 3/0446; G06F 3/0412; G06F 3/0443; G06F 2203/04111; G06F 2203/04103; H01L 51/5284; H01L 51/56; H01L 27/323; H01L 2251/5338; H01L 27/3211
See application file for complete search history.

(56) References Cited

U.S. PATENT DOCUMENTS

2021/0200365 A1* 7/2021 Lee ..................... H01L 27/3223

* cited by examiner

*Primary Examiner* — Deeprose Subedi
(74) *Attorney, Agent, or Firm* — Houtteman Law LLC

(57) ABSTRACT

The disclosure provides a display panel, a manufacturing method thereof and a display apparatus. The display panel includes a display substrate, a touch electrode and a plurality of anti-reflection structures, the touch electrode and the anti-reflection structures are arranged on one side of the display substrate; the orthographic projection of each anti-reflection structure on the display substrate correspondingly covers each sub-pixel, and the orthographic projection of the anti-reflection structures on the display substrate and the orthographic projection of the touch electrode on the display substrate do not overlap. The display panel can realize a touch function while realizing the anti-reflection function; meanwhile, the overall thickness of the display panel can be reduced, so that the display panel has good resistance to being folded repeatedly; meanwhile, the anti-reflection function of the display panel can be well compatible with the touch function.

19 Claims, 4 Drawing Sheets

DISPLAY PANEL AND MANUFACTURING METHOD THEREOF, AND DISPLAY APPARATUS

CROSS REFERENCE TO RELATED APPLICATIONS

The present disclosure claims the priority to the Chinese patent application No. 202010704341.2, filed on Jul. 21, 2020, which is hereby incorporated by reference in its entirety.

TECHNICAL FIELD

The disclosure belongs to the technical field of display, and particularly relates to a display panel, a manufacturing method thereof and a display apparatus.

BACKGROUND

Currently, a circular polarizer and a touch layer are generally required in an Organic Light-Emitting Diode (OLED) display technology, and are attached by an adhesive material to form a display module. The circular polarizer has a function of reducing surface reflection of the OLED and improving contrast, and the touch layer has a touch function. Because a large thickness of the circular polarizer results in a larger thickness of the whole display module, the flexible module cannot be folded repeatedly.

SUMMARY

The disclosure provides a display panel, a manufacturing method thereof and a display apparatus.

The display panel includes a display substrate, and a touch electrode and a plurality of anti-reflection structures arranged on one side of the display substrate, the display substrate includes a plurality of sub-pixels which are arranged at intervals, and an orthographic projection of the touch electrode on the display substrate is positioned in a space between adjacent sub-pixels of the plurality of sub-pixels; and an orthographic projection of each anti-reflection structure of the plurality of anti-reflection structures on the display substrate covers a corresponding sub-pixel in the plurality of sub-pixels, and an orthographic projection of the plurality of anti-reflection structures on the display substrate is not overlapped with the orthographic projection of the touch electrode on the display substrate.

In some embodiments, the anti-reflection structure includes at least one anti-reflection metal layer and at least two transparent insulating layers, the at least two transparent insulating layers and the at least one anti-reflection metal layer are alternately stacked in sequence, and each of the at least one anti-reflection metal layer is sandwiched between two corresponding adjacent transparent insulating layers of the at least two transparent insulating layers.

In some embodiments, the anti-reflection structure includes one anti-reflection metal layer and two transparent insulating layers, and the anti-reflection structure is located on a side of the touch electrode distal to the display substrate; and the two transparent insulating layers include a first transparent insulating layer and a second transparent insulating layer, and the anti-reflection structure includes the first transparent insulating layer, the anti-reflection metal layer and the second transparent insulating layer which are sequentially far away from the touch electrode.

In some embodiments, the first transparent insulating layer and the second transparent insulating layer further cover the space between adjacent sub-pixels of the plurality of sub-pixels.

In some embodiments, the touch electrode includes a touch electrode main body, and a plurality of openings are formed in the touch electrode main body; and an orthographic projection of each of the plurality of anti-reflection structures on the display substrate is within an orthographic projection of a corresponding one of the plurality of openings on the display substrate.

In some embodiments, the plurality of openings are rectangular, square, rhombic or polygonal.

In some embodiments, a distance between an orthographic projection of each of the plurality of anti-reflective structures on the display substrate and an orthographic projection of the touch electrode on the display substrate is greater than or equal to 0.1 μm.

In some embodiments, the touch electrode main body is in a grid shape; and the anti-reflection metal layer in each anti-reflection structure of the plurality of anti-reflection structures is in a block shape.

In some embodiments, a material of the anti-reflection metal layer includes any one of Ti, Mo, Cu, Al and Ag and any combination thereof; and a thickness of the anti-reflection metal layer ranges from 1 nm to 100 nm.

In some embodiments, a thickness of the first transparent insulating layer is in a range of 5 nm to 5000 nm, and a thickness of the second transparent insulating layer is in a range of 5 nm to 5000 nm; a refractive index of the first transparent insulating layer is in a range of 1.4-2.0, and a refractive index of the second transparent insulating layer is in a range of 1.4-2.0; and the first transparent insulating layer is made of silicon oxide, silicon nitride or an organic resin material; the second transparent insulating layer is made of silicon oxide, silicon nitride or an organic resin material.

In some embodiments, the display panel further includes a black matrix, the black matrix is arranged on a side of the second transparent insulating layer distal to the display substrate; and an orthographic projection of the black matrix on the display substrate covers the space between the adjacent sub-pixels of the plurality of sub-pixels, and the orthographic projection of the black matrix on the display substrate covers an orthographic projection of an edge of the anti-reflection metal layer on the display substrate.

In some embodiments, the orthographic projection of the black matrix on the display substrate covers the orthographic projection of the touch electrode on the display substrate.

In some embodiments, a minimum distance between an orthographic projection of an edge of the black matrix on the display substrate and the orthographic projection of the edge of the anti-reflective metal layer on the display substrate is greater than or equal to 0.1 μm.

In some embodiments, the touch electrode main body includes a plurality of driving electrodes and a plurality of induction electrodes; the plurality of driving electrodes extend along a first direction and are sequentially arranged along a second direction perpendicular to the first direction; the plurality of sensing electrodes extend along the second direction and are sequentially arranged along the first direction, and each sensing electrode of the plurality of sensing electrodes includes a plurality of sub-sections and a plurality of bridge parts; and the plurality of driving electrodes and the plurality of sub-sections of each of the plurality of sensing electrodes are arranged in a same layer and are insulated from each other, the plurality of bridge parts are arranged on one side of the plurality of sub-sections of each of the plurality of sensing electrodes and the plurality of driving electrodes proximal to the display substrate, and are insulated from the plurality of driving electrodes and the plurality of sub-sections of each of the plurality of sensing electrodes, and the plurality of bridge parts connect the plurality of sub-sections into a whole.

In some embodiments, orthographic projections of the plurality of driving electrodes, the plurality of sensing electrodes, and the plurality of bridge parts on the display substrate all fall into the space between adjacent sub-pixels of the plurality of sub-pixels.

In some embodiments, each of the plurality of sub-pixels includes an organic light emitting diode.

The present disclosure further provides a display apparatus, including the above display panel.

The present disclosure further provides a method for manufacturing a display panel, including: preparing a display substrate such that the display substrate includes a plurality of sub-pixels which are arranged at intervals; forming a touch electrode and a plurality of anti-reflection structures on one side of the display substrate such that an orthographic projection of the touch electrode on the display substrate is positioned in a space between adjacent sub-pixels of the plurality of sub-pixels; an orthographic projection of each anti-reflection structure of the plurality of anti-reflection structures on the display substrate correspondingly covers a corresponding sub-pixel of the plurality of the sub-pixels, and the orthographic projection of the anti-reflection structure on the display substrate is not overlapped with the orthographic projection of the touch electrode on the display substrate.

In some embodiments, the preparing the display substrate includes forming an encapsulation layer on the plurality of sub-pixels; and the forming a touch electrode and a plurality of anti-reflection structures on one side of the display substrate includes forming the touch electrode having a touch electrode main body and a plurality of openings in the touch electrode main body on the encapsulation layer, forming a first transparent insulating layer on the touch electrode, forming a plurality of anti-reflection structures on the first transparent insulating layer, and forming a second transparent insulating layer on the plurality of anti-reflection structures.

In some embodiments, the method further includes, after forming the second transparent insulating layer, forming a black matrix on one side of the second transparent insulating layer distal to the display substrate such that an orthographic projection of the black matrix on the display substrate covers the space between adjacent sub-pixels of the plurality of sub-pixels, the orthographic projection of the black matrix on the display substrate covers an edge of the orthographic projection of the anti-reflection metal layer on the display substrate, and the orthographic projection of the black matrix on the display substrate covers the orthographic projection of the touch electrode on the display substrate.

Wherein the reference numbers are:
1. display substrate; 10. sub-pixel; 11. back plate; 12. encapsulation layer; 2. touch electrode; 21. driving electrode; 22. sensing electrode; 220. sub-section; 23. bridge portion; 3. anti-reflection metal layer; 4. first transparent insulating layer; 5. second transparent insulating layer; 6. black matrix; 7. third transparent insulating layer; 8. anti-reflection structure; 9. buffer layer.

DETAIL DESCRIPTION OF EMBODIMENTS

In order to make a person skilled in the art better understand the technical solutions of the present disclosure, a display panel, a manufacturing method thereof, and a display apparatus of the present disclosure are described in further detail below with reference to the accompanying drawings and the detailed description.

According to a display panel provided by the disclosure, a touch electrode and a plurality of anti-reflection structures corresponding to a plurality of sub-pixels of the display panel are arranged on one side of the display substrate, so that the anti-reflection function is realized, and the touch function of the display panel can also be realized; the anti-reflection structures with a thinner thickness is adopted to replace a circular polarizer with a larger thickness in the related art, so that the whole thickness of the display panel can be reduced, and the flexible display panel can have good resistance to being folded repeatedly; meanwhile, the plurality of anti-reflection structures are arranged, and the orthographic projections of the anti-reflection structures on the display substrate and the orthographic projection of the touch electrode on the display substrate are not overlapped, so that the interference of an anti-reflection metal layer in the anti-reflection structure on touch signals obtained by the touch electrode can be reduced or eliminated, and the anti-reflection function and the touch function of the display panel can be well compatible with each other.

Figure 1A:
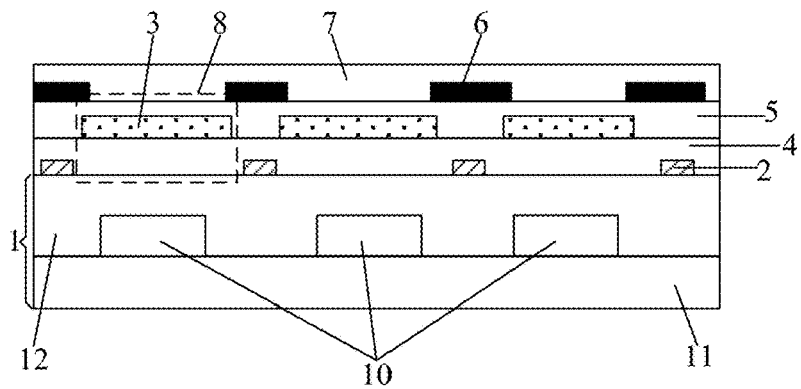
FIG. 1A is a schematic cross-sectional view of a structure of a display panel according to an embodiment of the disclosure.
Figure 1B:
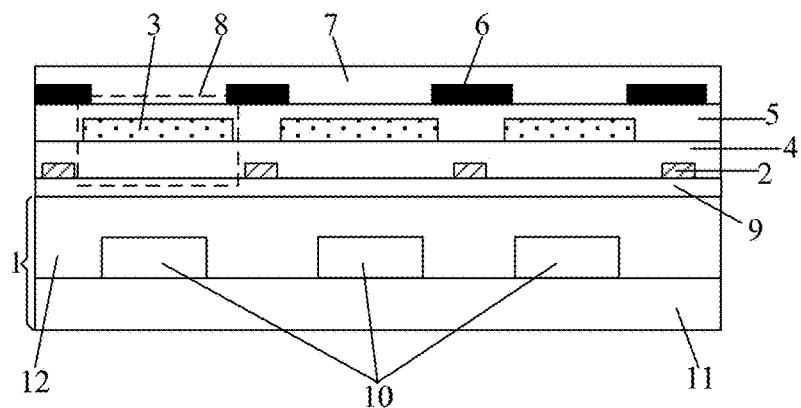
FIG. 1B is a schematic cross-sectional view of a structure of a display panel according to an embodiment of the disclosure.

As shown in FIGS. 1A and 1B, a display panel provided by an embodiment of the disclosure includes a display substrate 1, a touch electrode 2 and a plurality of anti-reflection structures 8, where the touch electrode 2 is disposed on one side of the display substrate 1, the display substrate 1 includes a plurality of sub-pixels 10 arranged at intervals, and an orthographic projection of the touch electrode 2 on the display substrate 1 is located in a space between adjacent sub-pixels 10; the orthographic projection of each anti-reflection structure 8 of the anti-reflection structures on the display substrate 1 correspondingly covers each sub-pixel 10, and the orthographic projection of the anti-reflection structures 8 on the display substrate 1 and the orthographic projection of the touch electrode 2 on the display substrate 1 do not overlap.

The plurality of anti-reflection structures 8 are disposed at different layers from the touch electrode 2. The plurality of sub-pixels 10 may include, for example, red, green and blue sub-pixels arranged in an array; one pixel is composed of at least one red sub-pixel, at least one green sub-pixel and at least one blue sub-pixel, and for example, one pixel is composed of two green sub-pixels, one red sub-pixel and one blue sub-pixel. Alternatively, each sub-pixel 10 is an OLED (Organic Electroluminescent Element), and the sub-pixel 10 includes an anode, a light emitting function layer, and a cathode, which are sequentially stacked. The display substrate 1 includes a back plate 11 and sub-pixels 10 (i.e., light emitting elements) disposed on the back plate 11, an encapsulation layer 12 is disposed on a side of the sub-pixels 10 distal to the back plate 11, and the touch electrode 2 and the plurality of anti-reflection structures 8 are disposed on a side of the encapsulation layer 12 distal to the back plate 11. The back plate 11 is provided with a pixel driving circuit (not shown) for driving the plurality of sub-pixels 10 to emit light.

Optionally, the anti-reflection structure 8 includes at least one anti-reflection metal layer 3 and at least two transparent insulating layers, the at least two transparent insulating layers and the at least one anti-reflection metal layer 3 are alternately stacked in sequence, and each anti-reflection metal layer 3 in the at least one anti-reflection metal layer is sandwiched between two adjacent transparent insulating layers of the at least two transparent insulating layers; the at least two transparent insulating layers also extend to the space between adjacent sub-pixels 10.

As shown in FIGS. 1A and 1B, the anti-reflection structure 8 includes one anti-reflection metal layer 3 and two transparent insulating layers, and the anti-reflection structure is located on a side of the touch electrode distal to the display substrate; the two transparent insulating layers include a first transparent insulating layer 4 and a second transparent insulating layer 5, and the anti-reflection structure includes the first transparent insulating layer 4, the anti-reflection metal layer 3 and the second transparent insulating layer 5 which are sequentially far away from the touch electrode 2. As shown in FIGS. 1A and 1B, the first transparent insulating layer 4 and the second transparent insulating layer 5 also cover the space between adjacent sub-pixels among the plurality of sub-pixels.

Figure 2:
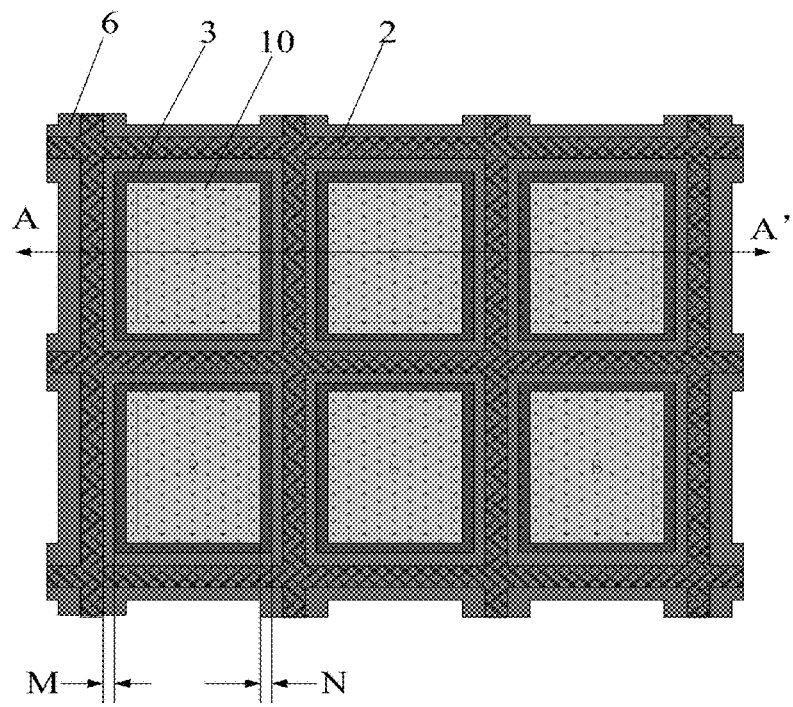
FIG. 2 is a schematic top view illustrating a structure of a display panel according to an embodiment of the disclosure.

As shown in FIGS. 1A, 1B and 2, the touch structure 2 is disposed on an encapsulation layer 12 of the display substrate 1 corresponding to the space between adjacent sub-pixels of a plurality of sub-pixels 10, the full-layer first transparent insulating layer 4 is formed on the touch structure 2, a pattern of a plurality of anti-reflection metal layers 3 of the plurality of anti-reflection structures 8 corresponding to the plurality of sub-pixels 10 one by one is disposed on the first transparent insulating layer 4 to correspond to the plurality of sub-pixels 10, a full-layer second transparent insulating layer 5 is formed on the pattern of the plurality of anti-reflection metal layers 3, a pattern of a black matrix 6 is disposed on the second transparent insulating layer 5 corresponding to the space between adjacent sub-pixels of the plurality of sub-pixels 10, and a third transparent insulating layer 7 is further formed on the pattern of the black matrix 6. As shown in FIGS. 1A and 1B, each of the anti-reflection structures 8 includes the first transparent insulating layer 4, the anti-reflection metal layer 3, and the second transparent insulating layer 5.

By arranging the touch electrode 2 and the plurality of anti-reflection structures 8 on one side of the display substrate 1, the anti-reflection function of the display panel is realized, and meanwhile, the touch function of the display panel can also be realized; the anti-reflection structure 8 with a thin thickness is adopted to replace a circular polarizer with a large thickness in the related art, so that the whole thickness of the display panel can be reduced, and the flexible display panel has good capability for being folded repeatedly; meanwhile, by providing the plurality of anti-reflection structures 8 and enabling the orthographic projections of the anti-reflection structures 8 on the display substrate 1 and the orthographic projection of the touch electrode 2 on the display substrate 1 to be not overlapped with each other, the interference of the anti-reflection metal layers 3 in the anti-reflection structures 8 on the touch signals of the touch electrode 2 can be reduced or eliminated, so that the anti-reflection function and the touch function of the display panel can be well compatible with each other.

As shown in FIG. 2, the touch electrode 2 includes a touch electrode main body, in which a plurality of openings are formed, and an orthographic projection of each of the plurality of anti-reflection structures 3 on the display substrate 1 is within an orthographic projection of a corresponding one of the plurality of openings on the display substrate 1, so that there is no overlapping portion between the orthographic projection of the plurality of anti-reflection structures 8 on the display substrate 1 and the orthographic projection of the touch electrode 2 on the display substrate 1. The openings may be rectangular, square, diamond shaped, polygonal, or the like. The present disclosure is not limited thereto.

Optionally, as shown in FIG. 2, on the display substrate, an orthographic projection distance M between the orthographic projection of each anti-reflection structure 8 of the plurality of anti-reflection structures 8 on the display substrate 1 and the orthographic projection of the touch electrode 2 on the display substrate 1 is greater than or equal to 0.1 μm. Such a distance range can better reduce or eliminate the conductive effect of the anti-reflection metal layer 3 and reduce the interference of the anti-reflection metal layer 3 on the touch signals of the touch electrode 2, so that the anti-reflection function and the touch function of the display panel can be well compatible with each other.

Alternatively, the touch electrode main body (i.e., the portion excluding the openings) of the touch electrode 2 is in a grid shape. The anti-reflection metal layers 3 in the plurality of anti-reflection structures 8 are discontinuously distributed, and the anti-reflection metal layer 3 in each anti-reflection structure 8 is in a block shape. The touch electrode 2 may be a Ti/Al/Ti laminate, the touch electrode body of the touch electrode 2 is in a grid shape, and the touch electrode 2 is located in the space between adjacent sub-pixels 10 in the plurality of sub-pixels 10, so that a full-area touch of the touch electrode 2 on the display panel can be realized, and a normal display of the display panel cannot be influenced. Each anti-reflection metal layer 3 of the anti-reflection structures 8 is a block structure, which can perform good dissipation on light irradiated thereon from the outside, and prevent the adverse effect of reflection of ambient light irradiated on the cathode on the contrast of the display panel.

Optionally, the anti-reflection structure 8 is located on a side of the touch electrode 2 distal to the display substrate 1, and the anti-reflection structure 8 includes a first transparent insulating layer 4, an anti-reflection metal layer 3, and a second transparent insulating layer 5, which are sequentially arranged away from the touch electrode 2. With such an arrangement, the anti-reflection structure 8 formed by the anti-reflection metal layer 3 and the first and second transparent insulating layers 4 and 5 can better dissipate the external ambient light, and the interference of the anti-reflection metal layer 3 on the touch signals of the touch electrode 2 can be well reduced or prevented by the first transparent insulating layer 4, so that the anti-reflection function and the touch function of the display panel can be well compatible with each other.

Optionally, the anti-reflection metal layer 3 is made of any one or a combination of Ti, Mo, Cu, Al and Ag. A thickness of the anti-reflection metal layer 3 is in a range of 1 nm to 100 nm. The anti-reflection metal layer 3 made of any one of these materials, when having a certain thickness, combines the first transparent insulating layer 4 and the second transparent insulating layer 5 on the upper and lower surfaces thereof, so as to realize low reflection, but has the characteristics of making certain light being transmitted, so that the external light is dissipated in the anti-reflection structure 8 to reduce the reflection, and at the same time, the light emitted by the light emitting device, such as the OLED, in the sub-pixel 10 can be emitted to the outside through the anti-reflection metal layer 3, thereby realizing the normal display of the display panel.

Optionally, the thickness of the first transparent insulating layer 4 ranges from 5 nm to 5000 nm, and the thickness of the second transparent insulating layer 5 ranges from 5 nm to 5000 nm. The refractive index of the first transparent insulating layer 4 is 1.4-2.0, and the refractive index of the second transparent insulating layer 5 is 1.4-2.0. The material of the first transparent insulating layer 4 is silicon oxide, silicon nitride or an organic resin material; the material of the second transparent insulating layer 5 is silicon oxide, silicon nitride or an organic resin material.

Figure 3:
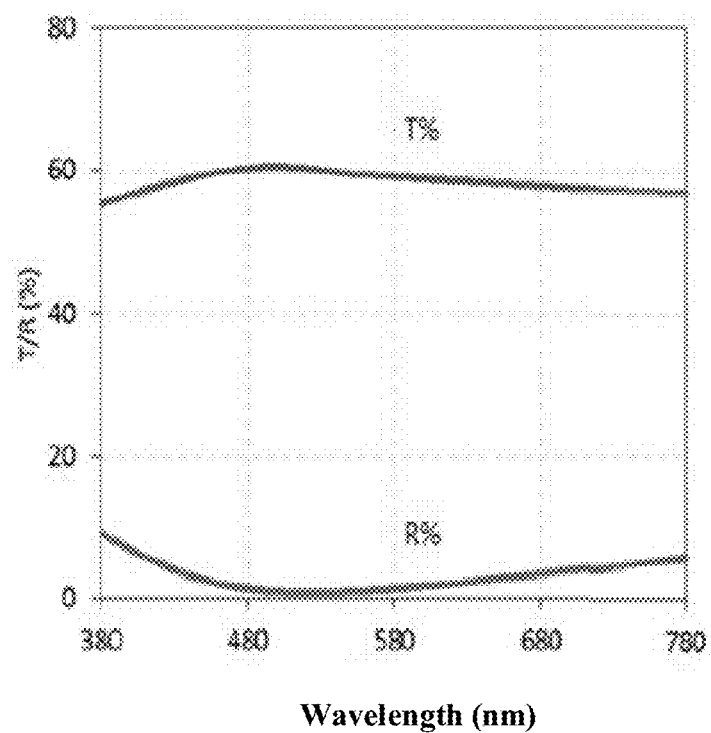
FIG. 3 is a graph illustrating a transmittance curve and a reflectivity curve of a light absorption structure formed by a first transparent insulating layer, an anti-reflection metal layer and a second transparent insulating layer in the display panel shown in FIG. 1A.

The anti-reflection metal layer 3 and its adjacent first transparent insulating layer 4 and second transparent insulating layer 5 together constitute a light absorption structure, i.e., an anti-reflection structure 8. As shown in FIG. 3, the light absorption structure has a transmittance T % that is adjustable from about 20% to about 70%, such as from about 35% to about 60%. The black matrix 6 may be a black body, and no light is reflected by the black matrix. The OLED display panel in the related art has a reflectivity of about 46% by itself. The OLED panel according to the embodiment of the present disclosure integrates the plurality of anti-reflection structures 8 disposed in one-to-one correspondence with the plurality of sub-pixels 10, so that the reflectivity R % of the OLED panel can be reduced to 5%, and the OLED panel has a touch function. For example, when a three-layer structure of the first transparent insulating layer 4/the anti-reflection metal layer 3/the second transparent insulating layer 5, which is made of silicon oxide/titanium/silicon oxide and has a thickness of 80 nm/5 nm/80 nm, is used, the light absorption structure itself has a transmittance of 58% and a reflectivity of 3%. In the present disclosure, after the light absorption structure is combined with the touch electrode 2 and the black matrix 6, the surface reflectivity of the obtained OLED display panel can be reduced from 46% to 8%. By changing the thickness of the anti-reflection metal layer 3, the transmittance of the OLED display panel may be in a range of 45-50%, the reflectivity is reduced to 5%, the display and anti-reflection requirements of the OLED display panel are met, and meanwhile, the touch function of the display panel can be realized through the touch electrode 2.

It should be noted that, a buffer layer 9 may be disposed on one side of the display substrate 1, and as shown in FIG. 1B, the touch electrode 2 may be disposed on the buffer layer 9 on a side distal to the display substrate. Since the encapsulation layer 12 for encapsulating the plurality of sub-pixels 10 in the display substrate 1 generally employs a stacked structure composed of an organic film and an inorganic film, in order to increase the adhesion of the touch electrode, the buffer layer 9 may be disposed on the encapsulation layer 12.

The buffer layer 9 can increase the adhesion of the touch electrode 2, and can also prevent the damage to a bottom layer trace or the surface of the encapsulation layer 12 in the subsequent process for etching a top layer pattern. A material of the buffer layer 9 may be, for example, silicon nitride or silicon oxide, and the thickness thereof may be in a range of 100 nm to 700 nm. For example, the buffer layer 9 may be selected to have a thickness of 300 nm.

Optionally, the display panel further includes a black matrix 6, where the black matrix 6 is disposed on a side of the second transparent insulating layer 5 distal to the display substrate 1; the orthographic projection of the black matrix 6 on the display substrate 1 covers the space between the adjacent sub-pixels 10 of the plurality of sub-pixels 10, and the orthographic projection of the black matrix 6 on the display substrate 1 covers an edge of the orthographic projection of the anti-reflection metal layer 3 on the display substrate 1. The black matrix 6 is made of a black strong absorption material, and the black matrix 6 covers the edge of the anti-reflection metal layer 3 in the anti-reflection structure 8, so that the reflection of a gap between the anti-reflection metal layer 3 and the touch electrode 2 can be prevented, the anti-reflection metal layer 3 and the touch electrode 2 are integrated, the total thickness of the display panel is reduced, the touch function and the anti-reflection function are integrated, and the bending resistance of the display panel is improved.

Alternatively, the plurality of sub-pixels 10 include red, green and blue sub-pixels arranged in an array. For example, one pixel is composed of at least one red sub-pixel, at least one green sub-pixel, and at least one blue sub-pixel. Alternatively, the sub-pixels 10 may be OLEDs (organic electroluminescent elements), and the black matrix 6 can also prevent color crosstalk between sub-pixels 10 of different colors.

Optionally, as shown in FIG. 2, a minimum distance N between the orthographic projection of the edge of the black matrix 6 on the display substrate 1 and the orthographic projection of the edge of the anti-reflection metal layer 3 on the display substrate 1 is greater than or equal to 0.1 That is, the edge of the orthographic projection of the black matrix 6 on the display substrate 1 covers the orthographic projection of the adjacent anti-reflection metal layer 3 on the display substrate 1 by 0.1 μm or more. Since the black matrix 6 is approximately a black body which does not reflect any light, the black matrix 6 can reduce the reflection of the gap between the anti-reflection metal layer 3 and the touch electrode 2, and the surface reflectivity of the gap between the anti-reflection metal layer 3 and the touch electrode 2 is prevented from being too high, so that the integration of the anti-reflection metal layer 3 and the touch electrode 2 is realized, the total thickness of the display panel is reduced, the touch function and the anti-reflection function are integrated, and the bending resistance of the display panel is improved.

Optionally, as shown in FIGS. 1A and 1B, the display panel further includes a third transparent insulating layer 7, and the third transparent insulating layer 7 is disposed on a side of the black matrix 6 distal to the display substrate 1. The third transparent insulating layer 7 is made of an organic resin material, silicon oxide material, or silicon nitride material. The third transparent insulating layer 7 can protect the black matrix 6 and the entire display substrate 1.

Figure 4:
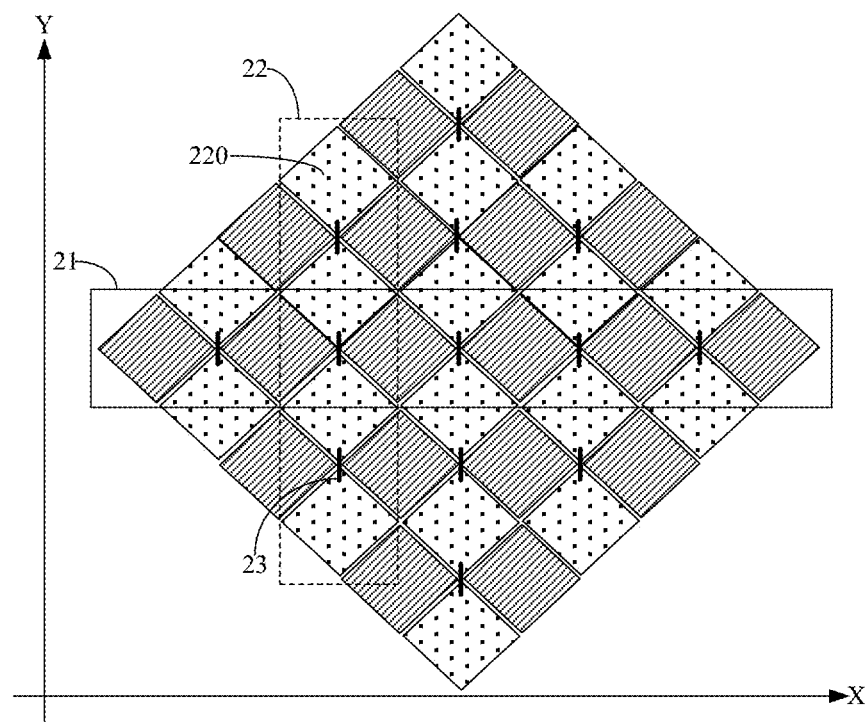
FIG. 4 is a schematic view illustrating a macro distribution of touch electrodes of a display panel according to an embodiment of the disclosure.
Figure 5:
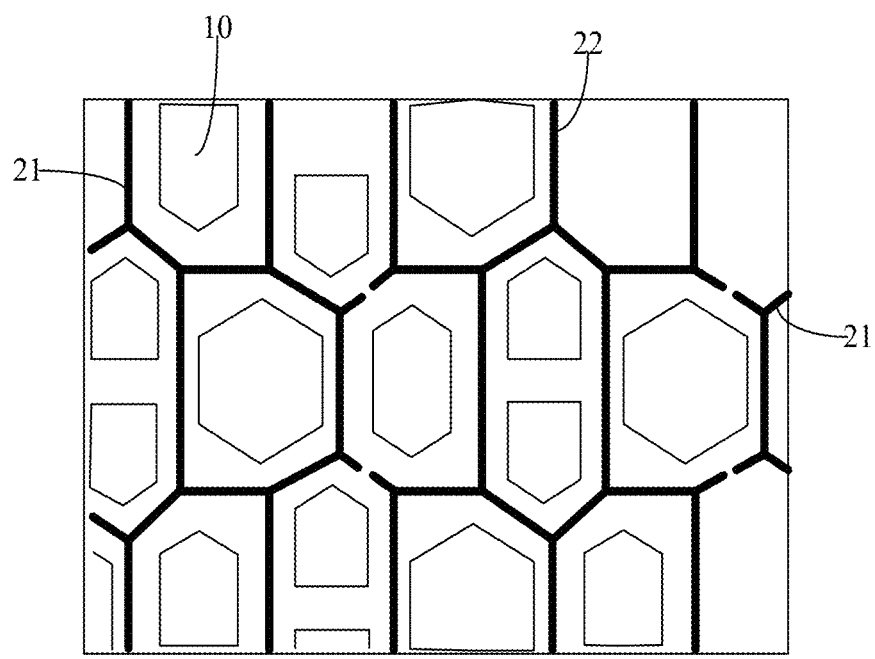
FIG. 5 is a schematic view illustrating a micro distribution of touch electrodes of a display panel according to an embodiment of the disclosure.
Figure 6:
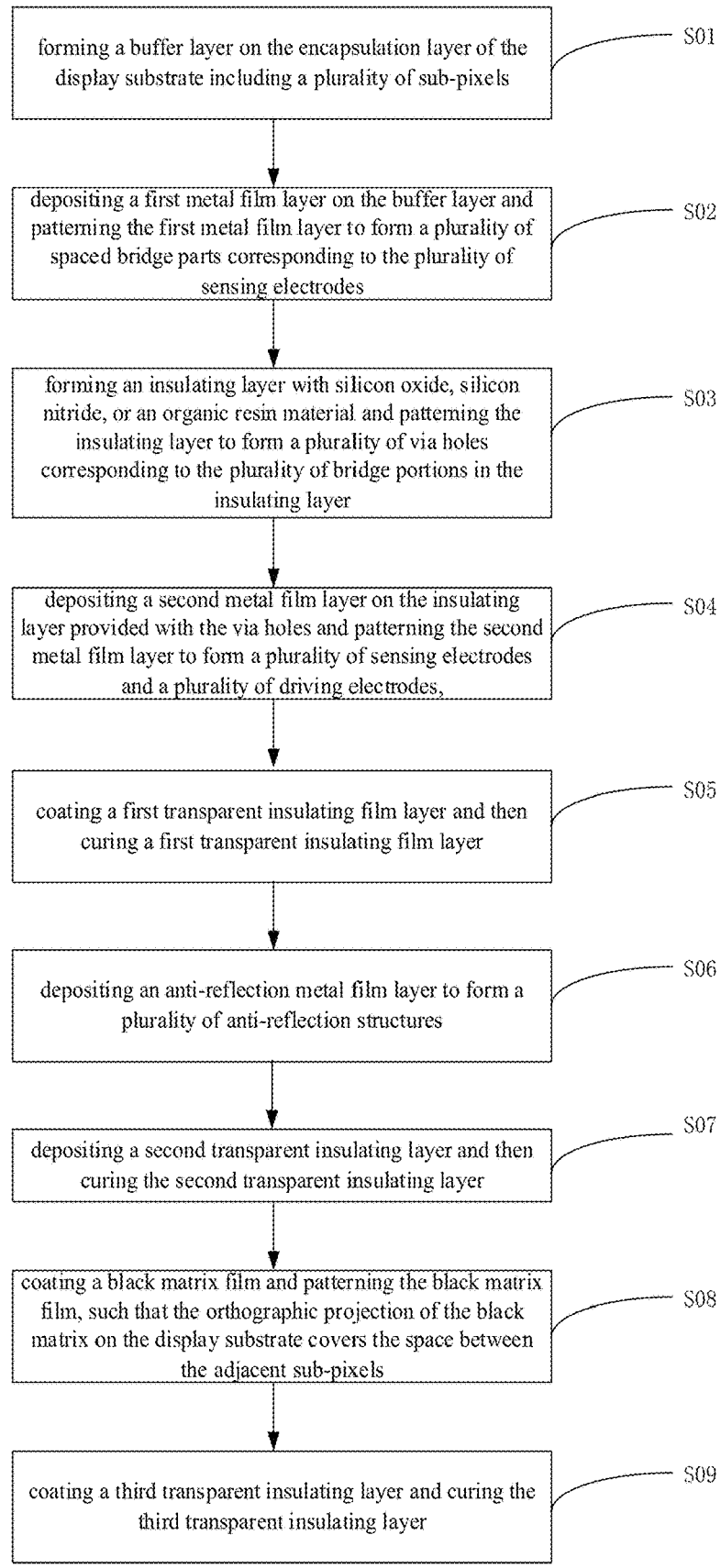
FIG. 6 is a flowchart of a method for manufacturing a display panel according to an embodiment of the present disclosure.

Alternatively, as shown in FIGS. 4 and 5, the touch electrode main body of the touch electrode 2 includes a plurality of driving electrodes 21, a plurality of sensing electrodes 22, and a plurality of bridge parts 23; the plurality of driving electrodes 21 and the plurality of sensing electrodes 22 are disposed on the same layer, the plurality of bridge parts 23 are disposed on one side of the plurality of driving electrodes 21 and the plurality of sensing electrodes 22 proximal to the display substrate 1, and an insulating layer may be disposed between the plurality of bridge parts 23, and the plurality of driving electrodes 21 and the plurality of sensing electrodes 22; the plurality of driving electrodes 21 extend along the first direction X and are arranged in sequence along the second direction Y; the plurality of sensing electrodes 22 include a plurality of sub-sections 220, and the plurality of bridge parts 23 may connect the plurality of sub-sections 220 into one body through a plurality of via holes in the insulating layer; the plurality of sensing electrodes 22 extend along the second direction Y and are sequentially arranged along the first direction X; the plurality of driving electrodes 21 and the plurality of sensing electrodes 22 are insulated from each other; the plurality of driving electrodes 21, the plurality of sensing electrodes 22, and the plurality of bridge parts 23 constitute the touch electrode main body of the touch electrode 2, whose orthographic projections on the display substrate respectively fall into the space between the adjacent sub-pixels. The driving electrodes 21 and the sensing electrodes 22 can realize mutual capacitance touch. That is, a plurality of openings are provided in the touch electrode main body, and the orthographic projection of the plurality of sub-pixels 10 on the display substrate 1 falls within the orthographic projection of the plurality of openings on the display substrate 1.

Alternatively, the plurality of driving electrodes 21 and the plurality of sensing electrodes 22 are disposed in the same layer, the plurality of bridge parts 23 and the plurality of sensing electrodes 22 are disposed in different layers, and an insulating layer is disposed between the plurality of bridge parts 23 and the plurality of sensing electrodes 22. Of course, the plurality of driving electrodes 21 and the plurality of sensing electrodes 22 may be disposed in different layers, that is, the plurality of driving electrodes 21 and the plurality of sensing electrodes 22 are disposed on different layers, respectively.

It should be noted that, the driving electrodes 21 and the sensing electrodes 22 may be arranged in any other way of achieving mutual capacitance touch, and are not limited to the above arrangement, which is not limited in this disclosure.

It should be noted that, the structure of the touch electrode 2 capable of realizing mutual capacitance touch is not limited to the above, and any other structure may be adopted as long as the orthographic projection of the touch electrode 2 on the display substrate 1 is ensured to be located in the space between the adjacent sub-pixels 10.

The touch electrode may also be a self-capacitance type touch electrode, which is used as both a driving electrode and a sensing electrode. As for the single-layer multi-point type self-capacitance touch electrode, the touch electrode lead and the sensing electrode are arranged on the same layer; As for the multi-layer self-capacitance touch electrode, the touch electrode lead and the sensing electrode are located on different layers, two metal layers are separated from each other by an insulating layer, the touch electrode lead and the corresponding sensing electrode are conducted through a via hole. The self-capacitance touch electrode may be arranged as the conventional self-capacitance touch electrode, and is not repeated herein.

Based on the above structure of the display panel, the present embodiment further provides a method for manufacturing the display panel, which includes preparing a display substrate, and forming a touch electrode and a plurality of anti-reflection structures on one side of the display substrate; the preparing the display substrate includes forming a plurality of sub-pixels arranged at intervals and an encapsulation layer for encapsulating the sub-pixels such that orthographic projection of the touch electrode on the display substrate is positioned in a space between the adjacent sub-pixels; the orthographic projection of each anti-reflection structure of the anti-reflection structures on the display substrate correspondingly covers each sub-pixel, and the orthographic projection of the anti-reflection structures on the display substrate does not overlap with the orthographic projection of the touch electrode on the display substrate, and the touch electrode includes a plurality of driving electrodes and a plurality of sensing electrodes.

In this embodiment, the method for manufacturing the display panel is as follows:

Step S01: forming a buffer layer on the encapsulation layer of the display substrate;

Step S02: depositing a first metal film layer on the buffer layer and patterning the first metal film layer to form a plurality of spaced bridge parts corresponding to the plurality of sensing electrodes, wherein the first metal film layer may be a Ti/Al/Ti laminated layer;

Step S03: forming an insulating layer with silicon oxide, silicon nitride, or an organic resin material and patterning the insulating layer to form a plurality of via holes corresponding to the plurality of bridge portions in the insulating layer;

Step S04: depositing a second metal film layer on the insulating layer provided with the via holes and patterning the second metal film layer to form a touch electrode main body including a plurality of sensing electrodes and a plurality of driving electrodes, so that the touch electrode includes the touch electrode main body and a plurality of openings arranged in the touch electrode main body, and the touch electrode main body includes the plurality of driving electrodes and the plurality of sensing electrodes, and an orthographic projection of the touch electrode on the display substrate is located in the space between adjacent sub-pixels, and orthographic projections of the anti-reflection structures on the display substrate are not overlapped with the orthographic projection of the touch electrode on the display substrate, and the second metal film layer may be a Ti/Al/Ti laminated layer; the bridge parts are respectively connected to the sensing electrodes through the via holes in the insulating layer;

Step S05: coating a first transparent insulating film layer and then curing a first transparent insulating film layer;

Step S06: depositing an anti-reflection metal film layer to form a plurality of anti-reflection structures; for example, a plurality of mutually spaced and mutually independent anti-reflection metal layers may be directly formed by vacuum evaporation of an anti-reflection metal material using a metal mask plate; or an anti-reflection metal film layer may be first formed by physical vapor deposition, and then patterned through a mask plate to form the plurality of anti-reflection metal layers which are separated from each other and are independent;

Step S07: depositing a second transparent insulating layer and then curing the second transparent insulating layer; for example, a material of the second transparent insulating layer is silicon oxide, and a thickness thereof is 80 nm;

Step S08: coating a black matrix film and patterning the black matrix film, such that the orthographic projection of the black matrix on the display substrate covers the space between the adjacent sub-pixels, and the orthographic projection of the black matrix on the display substrate covers the edge of the orthographic projection of the anti-reflection metal layer on the display substrate in the adjacent anti-reflection structure; the orthographic projection of the black matrix on the display substrate covers the orthographic projection of the touch electrode on the display substrate; and Step S09: coating a third transparent insulating layer and curing the third transparent insulating layer to complete the manufacturing method of the display panel.

In the present disclosure, the patterning process generally includes a process of performing steps such as exposure, development, and etching on a photoresist film layer using a mask plate to form a specific pattern.

According to the display panel provided by the embodiment of the disclosure, the touch electrode and the plurality of anti-reflection structures corresponding to the plurality of sub-pixels are arranged on one side of the display substrate, so that the touch function of the display panel can be realized while the anti-reflection function is realized; the anti-reflection structure with a thinner thickness is adopted to replace a circular polarizer with a larger thickness in the related art, so that the whole thickness of the display panel can be reduced, and the flexible display panel can have good resistance to being folded repeatedly; meanwhile, the plurality of anti-reflection structures are arranged such that the orthographic projections of the anti-reflection structures on the display substrate and the orthographic projection of the touch electrode on the display substrate are not overlapped, so that the interference of an anti-reflection metal layer in the anti-reflection structure on touch signals obtained by the touch electrode can be reduced or eliminated, and the anti-reflection function and the touch function of the display panel can be well compatible with each other.

The embodiment of the present disclosure further provides a display apparatus, which includes the display panel in the above embodiment.

By adopting the display panel in the embodiment, the anti-reflection function of the display apparatus can be well compatible with the touch function, and the overall thickness of the display apparatus can be reduced, so that the display apparatus has good bending resistance and is convenient for realizing a flexible display.

The display apparatus provided by the embodiment of the disclosure can be any product or component with a display function, such as an OLED panel, an OLED television, a display, a mobile phone, a navigator and the like.

It should be understood that, the above embodiments are merely exemplary embodiments employed to illustrate the principles of the present disclosure, and the present disclosure is not limited thereto. It will be apparent to a person skilled in the art that, various changes and modifications can be made therein without departing from the spirit and scope of the disclosure, and these changes and modifications are to be considered within the scope of the disclosure.

What is claimed is:

1. A display panel, comprising a display substrate, and a touch electrode and a plurality of anti-reflection structures arranged on one side of the display substrate, wherein
   the display substrate comprises a plurality of sub-pixels which are arranged at intervals, and an orthographic projection of the touch electrode on the display substrate is positioned in a space between adjacent sub-pixels of the plurality of sub-pixels; and
   an orthographic projection of each anti-reflection structure of the plurality of anti-reflection structures on the display substrate covers a corresponding sub-pixel in the plurality of sub-pixels, and an orthographic projection of the plurality of anti-reflection structures on the display substrate is not overlapped with the orthographic projection of the touch electrode on the display sub state,
   wherein the anti-reflection structure comprises at least one anti-reflection metal layer and at least two transparent insulating layers, the at least two transparent insulating layers and the at least one anti-reflection metal layer are alternately stacked in sequence, and each of the at least one anti-reflection metal layer is sandwiched between two corresponding adjacent transparent insulating layers of the at least two transparent insulating layers.

2. The display panel of claim 1, wherein the anti-reflection structure comprises one anti-reflection metal layer and two transparent insulating layers, and the anti-reflection structure is located on a side of the touch electrode distal to the display substrate; and
   the two transparent insulating layers comprise a first transparent insulating layer and a second transparent insulating layer, and the anti-reflection structure comprises the first transparent insulating layer, the anti-reflection metal layer and the second transparent insulating layer which are sequentially far away from the touch electrode.

3. The display panel of claim 2, wherein the first transparent insulating layer and the second transparent insulating layer further cover the space between adjacent sub-pixels of the plurality of sub-pixels.

4. The display panel of claim 2, wherein
   the touch electrode comprises a touch electrode main body, and a plurality of openings are formed in the touch electrode main body; and
   an orthographic projection of each of the plurality of anti-reflection structures on the display substrate is within an orthographic projection of a corresponding one of the plurality of openings on the display substrate.

5. The display panel of claim 4, wherein
   the plurality of openings are rectangular, square, rhombic or polygonal.

6. The display panel of claim 4, wherein a distance between an orthographic projection of each of the plurality of anti-reflective structures on the display substrate and an orthographic projection of the touch electrode on the display substrate is greater than or equal to 0.1 μm.

7. The display panel of claim 4, wherein
   the touch electrode main body is in a grid shape; and
   the anti-reflection metal layer in each anti-reflection structure of the plurality of anti-reflection structures is in a block shape.

8. The display panel of claim 4, wherein
   a material of the anti-reflection metal layer comprises any one of Ti, Mo, Cu, Al and Ag and any combination thereof; and a thickness of the anti-reflection metal layer ranges from 1 nm to 100 nm.

9. The display panel of claim 2, wherein
a thickness of the first transparent insulating layer is in a range of 5 nm to 5000 nm, and a thickness of the second transparent insulating layer is in a range of 5 nm to 5000 nm;
a refractive index of the first transparent insulating layer is in a range of 1.4-2.0, and a refractive index of the second transparent insulating layer is in a range of 1.4-2.0; and
the first transparent insulating layer is made of silicon oxide, silicon nitride or an organic resin material; the second transparent insulating layer is made of silicon oxide, silicon nitride or an organic resin material.

10. The display panel of claim 4, further comprising a black matrix, wherein
the black matrix is arranged on a side of the second transparent insulating layer distal to the display substrate; and
an orthographic projection of the black matrix on the display substrate covers the space between the adjacent sub-pixels of the plurality of sub-pixels, and the orthographic projection of the black matrix on the display substrate covers an orthographic projection of an edge of the anti-reflection metal layer on the display substrate.

11. The display panel of claim 10, wherein
the orthographic projection of the black matrix on the display substrate covers the orthographic projection of the touch electrode on the display substrate.

12. The display panel of claim 10, wherein a minimum distance between an orthographic projection of an edge of the black matrix on the display substrate and the orthographic projection of the edge of the anti-reflective metal layer on the display substrate is greater than or equal to 0.1 μm.

13. The display panel of claim 4, wherein
the touch electrode main body comprises a plurality of driving electrodes and a plurality of sensing electrodes;
the plurality of driving electrodes extend along a first direction and are sequentially arranged along a second direction perpendicular to the first direction;
the plurality of sensing electrodes extend along the second direction and are sequentially arranged along the first direction, and each sensing electrode of the plurality of sensing electrodes comprises a plurality of sub-sections and a plurality of bridge parts; and
the plurality of driving electrodes and the plurality of sub-sections of each of the plurality of sensing electrodes are arranged in a same layer and are insulated from each other, the plurality of bridge parts are arranged on one side of the plurality of sub-sections of each of the plurality of sensing electrodes and the plurality of driving electrodes proximal to the display substrate, and are insulated from the plurality of driving electrodes and the plurality of sub-sections of each of the plurality of sensing electrodes, and the plurality of bridge parts connect the plurality of sub-sections into a whole.

14. The display panel of claim 13, wherein orthographic projections of the plurality of driving electrodes, the plurality of sensing electrodes, and the plurality of bridge parts on the display substrate all fall into the space between adjacent sub-pixels of the plurality of sub-pixels.

15. The display panel of claim 1, wherein each of the plurality of sub-pixels comprises an organic light emitting diode.

16. A display apparatus, comprising the display panel of claim 1.

17. A method for manufacturing a display panel, comprising:
preparing a display substrate such that the display substrate comprises a plurality of sub-pixels which are arranged at intervals;
forming a touch electrode and a plurality of anti-reflection structures on one side of the display substrate such that an orthographic projection of the touch electrode on the display substrate is positioned in a space between adjacent sub-pixels of the plurality of sub-pixels; an orthographic projection of each anti-reflection structure of the plurality of anti-reflection structures on the display substrate correspondingly covers a corresponding sub-pixel of the plurality of the sub-pixels, and the orthographic projection of the anti-reflection structure on the display substrate is not overlapped with the orthographic projection of the touch electrode on the display substrate,
wherein the anti-reflection structure comprises at least one anti-reflection metal layer and at least two transparent insulating layers, the at least two transparent insulating layers and the at least one anti-reflection metal layer are alternately stacked in sequence, and each of the at least one anti-reflection metal layer is sandwiched between two corresponding adjacent transparent insulating layers of the at least two transparent insulating layers.

18. The method of claim 17, wherein
the preparing the display substrate comprises forming an encapsulation layer on the plurality of sub-pixels; and
the forming a touch electrode and a plurality of anti-reflection structures on one side of the display substrate comprises forming the touch electrode having a touch electrode main body and a plurality of openings in the touch electrode main body on the encapsulation layer, forming a first transparent insulating layer on the touch electrode, forming a plurality of anti-reflection structures on the first transparent insulating layer, and forming a second transparent insulating layer on the plurality of anti-reflection structures.

19. The method of claim 18, further comprising, after forming the second transparent insulating layer:
forming a black matrix on one side of the second transparent insulating layer distal to the display substrate such that an orthographic projection of the black matrix on the display substrate covers the space between adjacent sub-pixels of the plurality of sub-pixels, the orthographic projection of the black matrix on the display substrate covers an edge of the orthographic projection of the anti-reflection metal layer on the display substrate, and the orthographic projection of the black matrix on the display substrate covers the orthographic projection of the touch electrode on the display substrate.

\* \* \* \* \*